United States Patent
Kim et al.

(10) Patent No.: US 9,829,173 B2
(45) Date of Patent: Nov. 28, 2017

(54) VEHICULAR LAMP

(71) Applicant: LG INNOTEK CO., LTD., Seoul (KR)

(72) Inventors: Dong Kyun Kim, Seoul (KR); Ji Hoon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/228,621

(22) Filed: Aug. 4, 2016

(65) Prior Publication Data

US 2017/0038025 A1 Feb. 9, 2017

(30) Foreign Application Priority Data

Aug. 4, 2015 (KR) ........................ 10-2015-0109882

(51) Int. Cl.
| | | |
|---|---|---|
| *B60Q 1/00* | (2006.01) | |
| *F21S 8/10* | (2006.01) | |
| *H01L 35/02* | (2006.01) | |
| *H01L 35/28* | (2006.01) | |
| *H01L 35/30* | (2006.01) | |

(52) U.S. Cl.
CPC ........... *F21S 48/34* (2013.01); *F21S 48/1104* (2013.01); *F21S 48/115* (2013.01); *F21S 48/325* (2013.01); *F21S 48/328* (2013.01); *H01L 35/02* (2013.01); *H01L 35/28* (2013.01); *H01L 35/30* (2013.01)

(58) Field of Classification Search
CPC ...... F21S 48/34; F21S 48/1104; F21S 48/115; F21S 48/328; F21S 48/325; H01L 35/30; H01L 35/02; H01L 35/28
See application file for complete search history.

(56) References Cited

U.S. PATENT DOCUMENTS

| | | | | |
|---|---|---|---|---|
| 2011/0254446 | A1* | 10/2011 | Tominaga | F21S 48/1159 315/82 |
| 2012/0057364 | A1* | 3/2012 | Kishimoto | F21S 48/115 362/538 |
| 2013/0114279 | A1* | 5/2013 | Marley | F21S 48/115 362/516 |
| 2014/0283405 | A1* | 9/2014 | Yang | F26B 19/00 34/104 |
| 2015/0070927 | A1* | 3/2015 | Kurahashi | F21S 48/335 362/546 |

(Continued)

FOREIGN PATENT DOCUMENTS

| | | |
|---|---|---|
| DE | 10 2007 043 961 A1 | 3/2009 |
| DE | 10 2011 089 945 A1 | 6/2013 |
| EP | 2 020 569 A2 | 2/2009 |

(Continued)

*Primary Examiner* — Donald Raleigh
(74) *Attorney, Agent, or Firm* — Birch, Stewart, Kolasch & Birch, LLP

(57) ABSTRACT

Provided is a vehicular lamp including a lens unit, a light source module that includes a reflection unit disposed to have a gap from the lens unit and accommodating a light emitting element, a bezel unit that abuts the light source module and provides the gap between the lens unit and the light source module, and a thermoelectric circulation unit that provides air that has passed through a thermoelectric module to the inside of the gap, wherein a heat absorption unit of the thermoelectric module is in contact with the light source module.

20 Claims, 12 Drawing Sheets

(56) References Cited

U.S. PATENT DOCUMENTS

2016/0109088 A1\* 4/2016 Orr .................. F21S 48/34
                                                      362/520
2016/0215952 A1\* 7/2016 Dunn ................ F21S 48/34

FOREIGN PATENT DOCUMENTS

| JP | 6-314504 A | 11/1994 |
| JP | 2012-3847 A | 1/2012 |
| KR | 10-2012-0083126 A | 7/2012 |

\* cited by examiner (a)

(b)

(c)

(d)

(a)  (b)

(c)

VEHICULAR LAMP

CROSS-REFERENCE TO RELATED APPLICATION

This application claims priority to and the benefit of Korean Patent Application No. 2015-0109882, filed on Aug. 4, 2015, the disclosure of which is incorporated herein by reference in its entirety.

BACKGROUND

1. Field of the Invention

Embodiments of the present invention relate to a vehicular lamp structure capable of removing dew formed on a lens unit.

2. Discussion of Related Art

A head lamp of a vehicle is used for lighting a space in front of the vehicle during driving of the vehicle. A light source is disposed inside the head lamp, and an upper portion or a lower portion of the space in front of the vehicle is irradiated with light emitted from the light source.

A head lamp is placed in a high-temperature environment due to heat from a light source of the head lamp and heat and the like transferred from the engine of a vehicle, a temperature difference with the outside occurs, and thus dew is generated inside the head lamp.

Such a problem in which moisture is generated inside a head lamp causes problems leading to a failure and reduction in marketability of the light source unit of the head lamp, and various solutions are being proposed since the problem is recognized as a persistent problem of a vehicle headlamp system. However, the problem is not being solved at a fundamental level.

SUMMARY OF THE INVENTION

Thus, embodiments of the present invention have been devised to solve the objective described above and are particularly directed to providing a vehicular lamp in which a thermoelectric circulation unit is implemented using a structure in which a heat absorption unit of a thermoelectric module comes into contact with a heat generation source of a light source of a vehicular lamp to simultaneously promote heat dissipation, raise the temperature of the heat absorption unit of the thermoelectric module, and raise the temperature of a heat generation unit, thereby efficiently raising the temperature of hot air for removing dew formed on a surface of a lens unit.

Objectives of the embodiments not limited to the above-mentioned objective, and other objectives of the embodiments will be clearly understood by one skilled in the art from the following description.

To solve the objective described above, according to an embodiment of the present invention, there is provided a vehicular lamp including a lens unit, a light source module that includes a reflection unit disposed to have a gap from the lens unit and accommodating a light emitting element, a bezel unit that abuts the light source module and provides the gap between the lens unit and the light source module, and a thermoelectric circulation unit that provides air that has passed through a thermoelectric module to the inside of the gap, wherein a heat absorption unit of the thermoelectric module comes into contact with the light source module.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
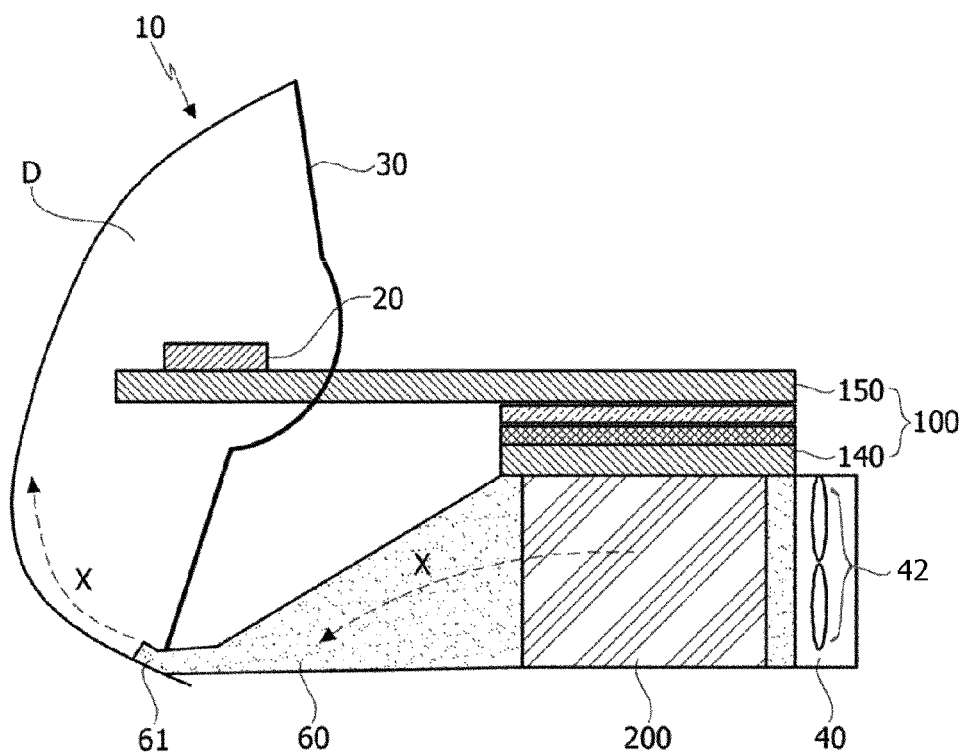
FIG. 1 is a cross-sectional conceptual view of a structure of a vehicular lamp according to an embodiment of the present invention.

Hereinafter, configurations and actions according to the present invention will be described in detail with reference to the accompanying drawings. In describing the configurations and actions with reference to the accompanying drawings, like reference numerals will be given to like elements regardless of signs in the drawings, and overlapping descriptions thereof will be omitted. Although terms such as "first" and "second" may be used herein to describe various elements, these elements are not limited by these terms. These terms are only used to distinguish one element from another.

FIG. 1 is a cross-sectional conceptual view of a structure of a vehicular lamp according to an embodiment of the present invention.

Referring to FIG. 1, a vehicular lamp according to an embodiment of the present invention may include a lens unit 10, a light source module 20 that includes a reflection unit disposed to have a gap D from the lens unit 10 and accommodating a light emitting element, a bezel unit 30 that abuts the light source module 20 and provides the gap D between the lens unit 10 and the light source module 20, and a thermoelectric circulation unit 40 that provides air that has passed through a thermoelectric module 100 to the inside of the gap D. In this case, a heat absorption unit of the thermoelectric module 100, i.e., a heat conversion member such as a second substrate 150 or a heat sink on the second substrate 150, may be implemented as a structure that comes into contact with a region of the light source module 20. In this way, heat dissipation from the light source of the vehicular lamp is promoted, the temperature of the heat absorption unit of the thermoelectric module is raised, and the temperature of a heat generation unit is raised at the same time, thereby efficiently raising the temperature of hot air for dehumidification.

Specifically, the lens unit 10 may be an outermost lens of a headlamp of a vehicle, and the lens unit 10 forms an overall exterior of the lamp by being coupled to a housing (refer to FIG. 3) of the lamp.

In the case of the light source module 20 that projects light to the outside through the lens unit 10, one or a plurality thereof may be disposed. According to an embodiment of the present invention, for example, a low beam 20L and a high beam 20H may be disposed. The light source module 20 may include a structure including a light emitting package having a solid-state light emitting element such as a halogen lamp, a high-intensity discharge (HID) lamp, a light emitting diode (LED), a lase diode (LD), or an organic LED (OLED) and a reflection member formed adjacent to the light emitting element.

The bezel unit 30 is disposed at a portion surrounding a light output surface of the light source module 20. The bezel unit 30 may be a middle cover member that brings aesthetics to the inside of the vehicular lamp and performs a reflecting function. In this embodiment, air heated in the heat generation unit of the thermoelectric module 100 may be supplied into the gap D between a rear surface of the lens unit 10 and the bezel unit 30 to remove dew formed on a surface of the lens unit. Further, to maximize thermoelectric efficiency of the thermoelectric module 100, the second substrate 150 that forms a heat absorption region of the thermoelectric module 100 or a cooling heat conversion member (hereinafter, referred to as "second heat conversion member) that comes into contact with the second substrate 150 may directly be in contact with an outer surface such as a case or the reflection member of the light source module 20 to simultaneously allow heat generated in the light source module 20 to be dissipated, the temperature of the heat absorption unit to be raised, and the temperature of the heat generation unit to be raised as a result, thereby raising the overall temperature of warm air.

Specifically, when the second substrate 150 that forms the heat absorption unit or the second heat conversion member (320 in FIG. 8) disposed above the second substrate 150 comes into contact with the light source module 20 which is generating heat, in addition to the effect of dissipating heat generated from the light source, the temperature of a cooling unit of the thermoelectric module is raised to a predetermined extent, and the temperature of the heat generation unit may be further increased according to set thermoelectric capacity of the thermoelectric module, thereby more efficiently raising the temperature of warm air.

For example, when capacity is set such that a temperature variation ΔT of the heat generation unit and the cooling unit of the thermoelectric module applied to the embodiment of the present invention is 40° C., the temperature of the cooling unit is 40° C., and the temperature of the heat generation unit is 80° C., 80° C. is normally the temperature at which air can be converted into warm air. However, when the second heat conversion member comes into contact with the light source unit and the temperature is raised to a predetermined extent and becomes 50° C., the maximum temperature of the heat generation unit may be raised up to 90° C. due to the set temperature variation of 40° C. In this case, the temperature of warm air may be raised up to 90° C., and thus there is an advantage in that air of a higher temperature can be implemented with the same power.

In the structure illustrated in FIG. 1, a first heat conversion unit 200 that includes a first heat conversion member (refer to 52 in FIGS. 3 and 220 in FIG. 8) may be disposed on a first substrate 140 that forms the heat generation unit of the thermoelectric module 100. The thermoelectric circulation unit 40 that guides air outside or inside the lamp to the inside of the first heat conversion member may be disposed behind the first heat conversion unit 200. The thermoelectric circulation unit 40 may have a first air blowing module 42 that includes a blower fan. The first air blowing module 42 may provide air to the first heat conversion member. Other than above, although not illustrated, the thermoelectric circulation unit 40 may include a circuit board having a power supply unit or a wiring unit that applies power to the first air blowing module 42, and a control unit.

A vehicular lamp according to an embodiment of the present invention may include an air blowing guide unit 60 having one end connected to the first heat conversion member and the other end communicating with the gap D. Air flows by the thermoelectric circulation unit 40, the air passes through the first heat conversion member, and the air is heated due to a heat generation effect such that the temperature of the air increases. The heated air flows along the air blowing guide unit 60 having a structure adjacent or connected to the first heat conversion unit 200. The flowing air applies warm air X from a discharge unit 61, which is an end of the air blowing guide unit 60, to the gap D. Dew formed on the surface of the lens unit 10 may be removed by the warm air X applied as above. As described above, heat generated from the light source module 20 itself may be efficiently dissipated by the second substrate 150 that forms the heat absorption unit of the thermoelectric module 100 coming into contact with the light source module 20 or, although not illustrated, by the second heat conversion member disposed on the second substrate 150 coming into contact with the light source module 20. In this way, the warm air X may be efficiently provided. At the same time, as the temperature of the heat generation unit increases according to the temperature of the cooling unit of the thermoelectric module increasing to a predetermined extent, an advantage in that an effect of heating the air is improved even with the same power can be realized.

Figure 2:
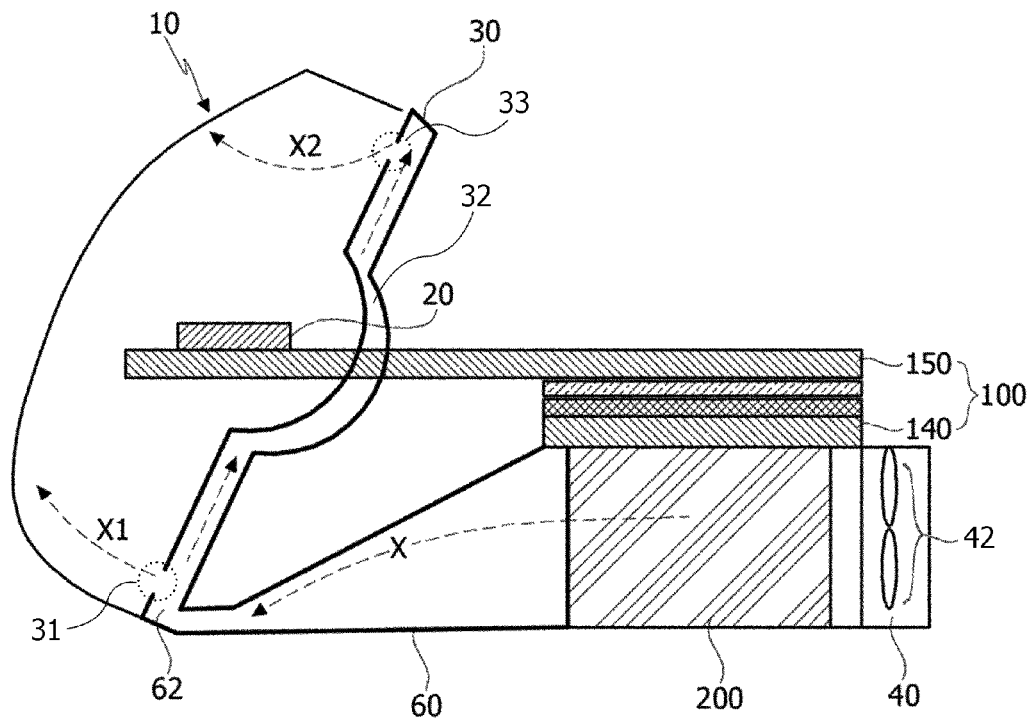
FIG. 2 is a view illustrating an embodiment that is different from the embodiment of the vehicular lamp shown in FIG. 1.

FIG. 2 is a view illustrating an embodiment that is different from the embodiment of the vehicular lamp shown in FIG. 1.

The contact structure between the thermoelectric module 100 and the light source module 20 and the structure of the first heat conversion unit 200 may be identically applied to both of the structure illustrated in FIG. 2 and the structure illustrated in FIG. 1.

A difference between the structure illustrated in FIG. 2 and the structure illustrated in FIG. 1 is that the structure of the part for guiding air that has been converted to warm air by passing through the first heat conversion unit 200 to the gap D is changed. That is, an airflow channel unit 32 through which air may flow is formed at a surface or the inside of the bezel unit 30 to guide air provided by the thermoelectric circulation unit 40 to be described below to allow warm air to enter the gap D between the lens unit 10 and the bezel unit 30 from the surface of the bezel unit 30.

That is, the vehicular lamp according to an embodiment of the present invention has the thermoelectric circulation unit 40 that provides warm air to remove dew formed on the surface region of the lens unit 10. The warm air is provided by the thermoelectric module 100, and, simultaneously, the flow of the warm air is guided by the airflow channel unit 32 implemented inside or at an outer surface of the bezel unit 30. Accordingly, the warm air is directly provided over the entire surface of the lens unit 10 as well as a partial region thereof such as an edge portion of a lens where dew is frequently formed such that dew formation can be suppressed.

The warm air is guided along the airflow channel unit 32 and is discharged through air discharge units 31 and 33 disposed at a surface of the bezel unit 30. In this case, the air discharge units 31 and 33 may be disposed at two or more regions of the surface region of the bezel unit to intensively apply warm air to a partial region where dew is frequently formed to remove dew even with small power. In this way, efficiency can be improved.

The air discharge units 31 and 33 may be formed as one or a plurality of holes or slit structures at left and right edge portions or edges at other portions of the lens unit 10. The shape of the air discharge units 31 and 33 may include a wedge-shaped hole structure in which diffusion to a surface of a lens is possible or a slit structure having a predetermined length to control the wind direction, but the structure is merely an example and the shape is not limited thereto.

One end of the airflow channel unit 32 may communicate with the thermoelectric circulation unit 40, and the other end thereof may communicate with the gap D. Although a structure in which the airflow channel unit 32 is disposed at the outer surface of the bezel unit 30 is illustrated as an example in FIG. 2, a flow channel may also be formed inside the bezel unit 30 in another embodiment of the present invention. When a flow channel is formed inside the bezel unit 30, an outer structure of the bezel unit 30 is simplified and thinned overall, and there may be an advantage in that a wider space may be secured for disposing the thermoelectric module and the thermoelectric circulation unit mounted within a limited space.

A second air blowing module such as a controllable blower fan with an auxiliary function may also be disposed inside the airflow channel unit 32 to enhance airflow. In the structure of FIG. 2, the thermoelectric circulation unit 40 having one first air blowing module 42 is disposed in an extremely limited space such as a front portion of a vehicle. Thus, a degree of design freedom may be limited, and it may be difficult to implement desired output of air volume or air pressure. Consequently, a stronger air pressure may be implemented when an auxiliary blower fan is disposed.

According to yet another embodiment of the present invention, the structure is not limited to that illustrated in FIG. 2 having one air blowing module and one thermoelectric module, and the structure may be modified to a structure having a plurality of thermoelectric modules, a plurality of heat conversion members (e.g., heat sink members) that implement warm air, and a plurality of blower fans, or a structure in which a plurality of blower fans share one thermoelectric module.

Figure 3:
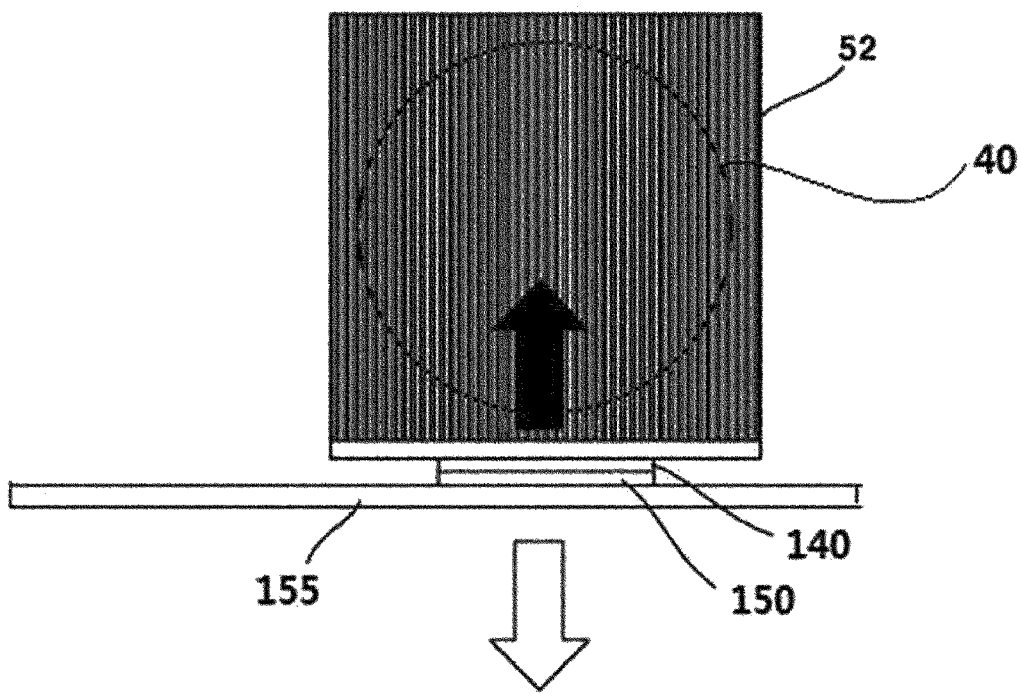
FIG. 3 is a view schematically illustrating a structure of a thermoelectric circulation unit in FIGS. 1 and 2 viewed from the front.

FIG. 3 is a view schematically illustrating a structure of a thermoelectric circulation unit in FIGS. 1 and 2 viewed from the front.

The thermoelectric module applied to an embodiment of the present invention may include a plurality of thermoelectric semiconductor elements disposed between the first substrate 140 and the second substrate 150 facing each other. In this case, a heat generation region may be implemented within a region of the first substrate 140 according to the thermoelectric effect, and a structure such as a first heat conversion member 52 may be disposed thereon as illustrated in FIG. 3. The thermoelectric circulation unit 40 including the first air blowing module is disposed behind the first heat conversion member 52. Air passing through the first heat conversion member 52 may be converted into warm air.

From the structures in FIGS. 1 and 2, the second substrate 150 illustrated in FIG. 3 comes into contact with the light source module 20. The thermoelectric circulation unit 40 is disposed behind the first heat conversion member 52. Air that has passed through the first heat conversion member 52 (the black arrow) is converted into heated warm air.

Figure 4:
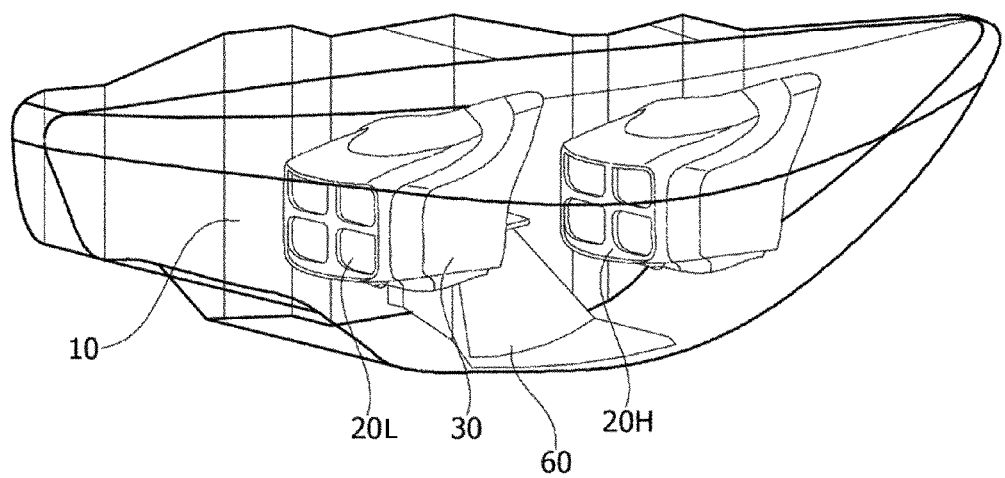
FIG. 4 is a perspective view of an implementation image of a vehicular lamp according to an embodiment of the present invention.
Figure 5:
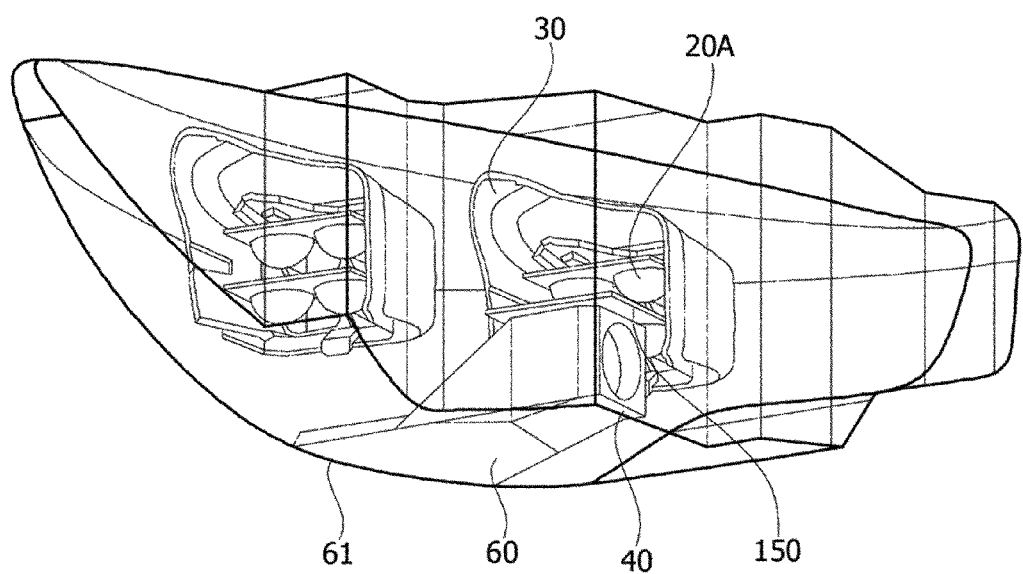
FIG. 5 is a perspective view illustrating a rear image of FIG. 4.

FIG. 4 is a perspective view of an implementation image of a vehicular lamp according to an embodiment of the present invention, and FIG. 5 is a perspective view illustrating a rear image of FIG. 4.

Referring to FIGS. 4 and 5, as described with reference to FIG. 1, the second substrate 150 that performs a cooling (heat absorption) action of the thermoelectric module is disposed in a structure that comes into contact with an outer case 20A of the light source module. The first heat conversion unit 200 in which the second heat conversion member is accommodated is disposed above the first substrate 140. The thermoelectric circulation unit 40 is disposed behind the first heat conversion unit 200, and warm air is generated by the thermoelectric circulation unit 40. The warm air may be discharged through the discharge unit 61, which is an end of the air blowing guide unit 60, and then supplied to the surface of the lens unit as illustrated in the conceptual view of FIG. 1.

Hereinafter, various embodiments of a thermoelectric module applied to the vehicular lamp according to an embodiment of the present invention described above will be described.

Figure 6:
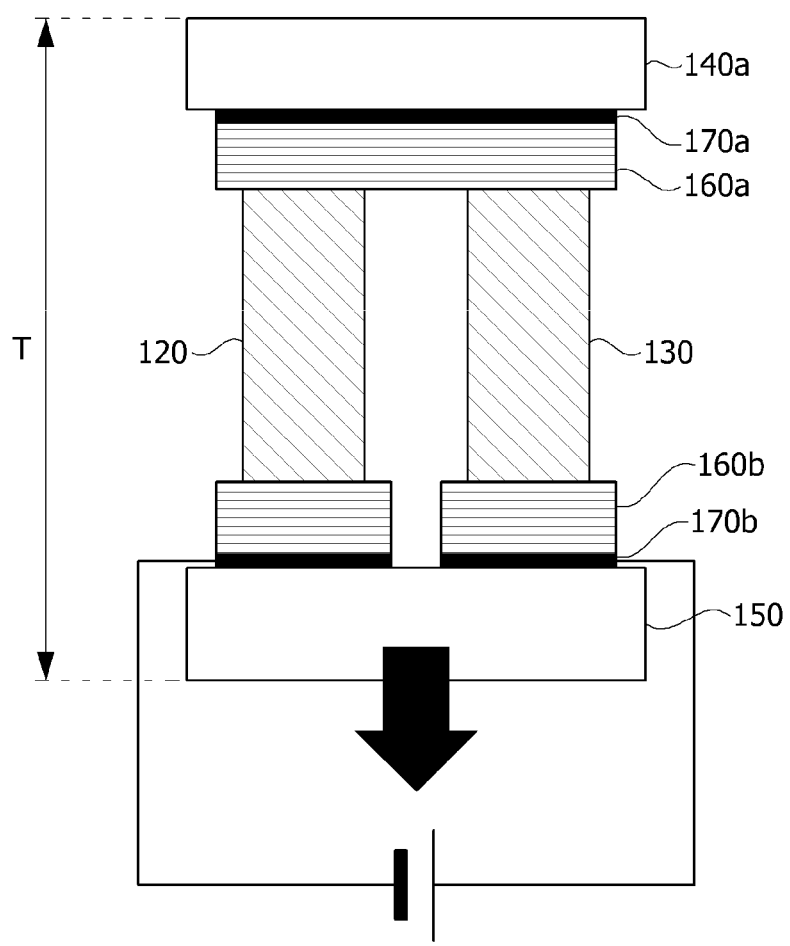
FIG. 6 is a cross-sectional view of a main part of a thermoelectric module according to an embodiment of the present invention applied to the vehicular lamp shown in FIG. 2.
Figure 7:
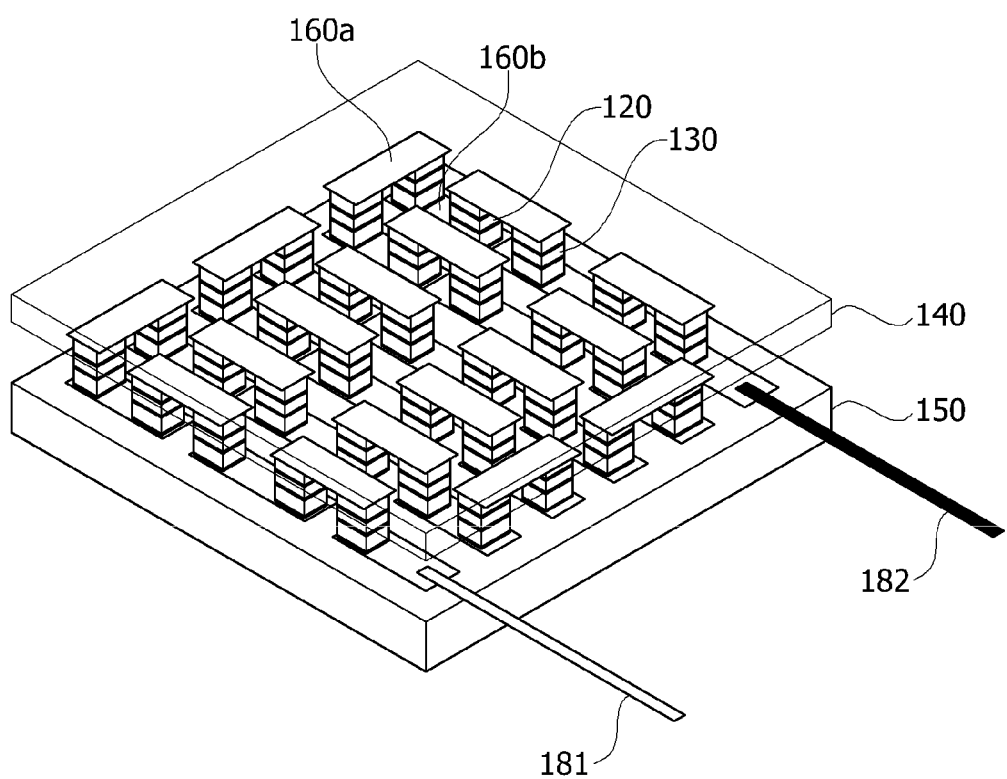
FIG. 7 is a view illustrating an example of modularizing and extending the structure in FIG. 6.

FIG. 6 is a cross-sectional view of a main part of a thermoelectric module according to an embodiment of the present invention applied to the vehicular lamp shown in FIG. 2, and FIG. 7 is a view illustrating an example of modularizing and extending the structure in FIG. 6.

The thermoelectric module 100 applied to the vehicular lamp according to an embodiment of the present invention is implemented with a structure in which a first semiconductor element 120 and a second semiconductor element 130 are disposed between the first substrate 140 and the second substrate 150 facing each other. The first heat conversion unit 200 that performs a heat generation function is disposed on the first substrate 140 to perform a heat generating action, and a second heat conversion unit 300 that performs a heat absorption function is disposed on the second substrate 150 to perform a cooling function. Although it will be described below, the first heat conversion unit 200 is defined as a module including the first heat conversion member 52 in FIG. 3.

In the thermoelectric module 100, an insulating substrate, e.g., an alumina substrate, may be used for the first substrate 140 and the second substrate 150. In a case of another embodiment, a metal substrate may be used therefor to implement heat absorption, heat generation efficiency, and thinning of the thermoelectric module 100. Of course, when the first substrate 140 and the second substrate 150 are formed with a metal substrate, dielectric layers 170a and 170b formed between the first substrate 140 and an electrode layer 160a and between the second substrate 150 and an electrode layer 160b, respectively, are preferably further included.

In the case of a metal substrate, copper (Cu) or a Cu alloy may be applied, and a thickness that can be thinned may be formed in a range of 0.1 mm to 0.5 mm. When the thickness of the metal substrate is less than 0.1 mm or exceeds 0.5 mm, a heat dissipation property may be excessively high or thermal conductivity may be too high, and thus reliability of the thermoelectric module is considerably decreased. In addition, in the case of the dielectric layers 170a and 170b, when thermal conductivity of a cooling thermoelectric module is taken into consideration, a material having thermal conductivity of 5 W/K to 10 W/K may be used as a dielectric material having high heat dissipation performance, and the thickness thereof may be formed in a range of 0.01 mm to 0.15 mm. In this case, insulation efficiency (or a voltage withstanding property) is considerably decreased when the thickness is less than 0.01 mm, and thermal conductivity is lowered and heat dissipation efficiency is decreased when the thickness exceeds 0.15 mm. The electrode layers 160a and 160b electrically connects the first semiconductor element and the second semiconductor element to each other using an electrode material such as Cu, silver (Ag), and nickel (Ni), and when the unit cell illustrated in FIG. 6 is connected in a plurality, the electrode layers 160a and 160b electrically connect adjacent unit cells to each other as illustrated in FIG. 7. The thickness of the electrode layers may be formed in a range of 0.01 mm to 0.3 mm. Performance as an electrode is lowered and electrical conductivity becomes poor when the thickness of the electrode layers is less than 0.01 mm, and conduction efficiency also decreases due to an increase in resistance when the thickness thereof exceeds 0.3 mm.

FIG. 7 may have a structure in which a unit cell that is the same as the structure of FIG. 6 (formed of a pair of thermoelectric semiconductor elements) is connected in a plurality and modularized. In this case, although it will be described below, a thermoelectric element including a unit element of a stacking structure according to FIG. 12 may be applied as the thermoelectric elements that form the unit cell. In this case, the first semiconductor element 120 may be a p-type semiconductor, and the second semiconductor element 130 may be an n-type semiconductor. The first semiconductor element 120 and the second semiconductor element 130 are connected to the electrode layers 160a and 160b, such structure is formed in a plurality, and the Peltier effect is realized using circuit wires 181 and 182 through which current is supplied to the semiconductor elements via electrodes.

A p-type semiconductor material or an n-type semiconductor material may be applied to the semiconductor elements in the thermoelectric module. The n-type semiconductor material may be formed using a mixture in which a bismuth telluride based (BiTe-based) main raw material including selenium (Se), Ni, aluminum (Al), Cu, Ag, lead (Pb), boron (B), gallium (Ga), tellurium (Te), Bi, and indium (In) and Bi or Te corresponding to 0.001 wt % to 1.0 wt % of the total weight of the main raw material are mixed. For example, the n-type semiconductor material may be formed using a Bi—Se—Te material as the main raw material and by further adding Bi or Te corresponding to 0.001 wt % to 1.0 wt % of the total weight of the Bi—Se—Te material thereto. That is, when 100 g of the Bi—Se—Te material is injected, a weight of Bi or Te being further mixed therewith is preferably in a range of 0.001 g to 1.0 g. The weight range of the material being added to the main raw material described above is significant in that an improvement of a ZT value cannot be expected out of the range 0.001 wt % to 0.1 wt % due to thermal conductivity not being lowered and electrical conductivity being lowered.

The p-type semiconductor material is preferably formed using a mixture in which a BiTe-based main raw material including Se, Ni, Al, Cu, Ag, Pb, B, Ga, Te, Bi, and In and Bi or Te corresponding to 0.001 wt % to 1.0 wt % of the total weight of the main raw material are mixed. For example, the p-type semiconductor material may be formed using a Bi-stibium (Sb)—Te material as the main raw material and by further adding Bi or Te corresponding to 0.001 wt % to 1.0 wt % of the total weight of the Bi—Sb—Te material thereto. That is, when 100 g of the Bi—Sb—Te material is injected, a weight of Bi or Te being further mixed therewith is preferably in a range of 0.001 g to 1.0 g. The weight range of the material being added to the main raw material described above is significant in that an improvement of a ZT value cannot be expected out of the range 0.001 wt % to 0.1 wt % due to thermal conductivity not being lowered and electrical conductivity being lowered.

The shapes and sizes of the first semiconductor element and the second semiconductor element facing each other while forming a unit cell are the same. However, considering that a difference between electrical conductivities of the p-type semiconductor element and the n-type semiconductor element acts as a factor that lowers cooling efficiency, volumes of the semiconductor elements facing each other may also be differently formed to improve cooling performance.

That is, the volumes of the semiconductor elements of the unit cell disposed by facing each other may be differently formed by differently forming overall shapes of the semiconductor elements, forming a diameter of a cross-section of any one of the semiconductor elements having the same height to be wider, or differently forming heights or diameters of cross-sections of the semiconductor elements of the same shape. The diameter of the n-type semiconductor element may be formed to be larger than that of the p-type semiconductor element to increase the volume of the n-type semiconductor element to improve thermoelectric efficiency.

Figure 8:
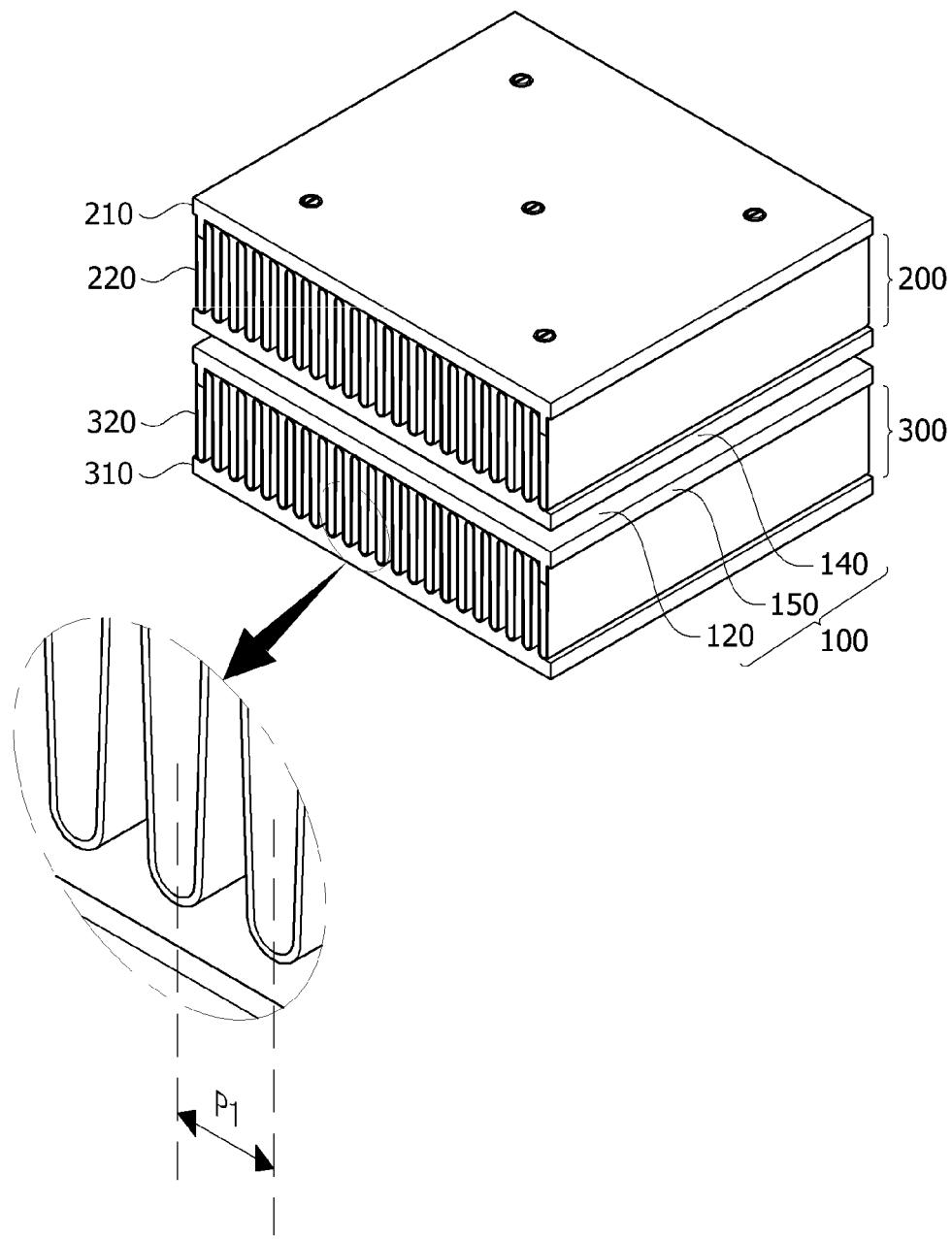
FIG. 8 is a view illustrating another embodiment of the thermoelectric module and a heat conversion member described with reference to FIGS. 2 and 4.

FIG. 8 is a view illustrating another embodiment of the thermoelectric module and a heat conversion member described with reference to FIGS. 2 and 4. Although a structure in which a plurality of heat dissipation fins having a thin plate-like structure are disposed is illustrated in FIG. 4 as an example of a structure of the first heat conversion member described above, an example in which a structure having a curvature is applied to a form of the heat conversion member to maximize heat generation or cooling efficiency is illustrated in FIG. 8.

Referring to FIG. 8, a structure having the first heat conversion unit 200 disposed above the thermoelectric module 100 including thermoelectric semiconductor elements between a pair of substrates and the second heat conversion unit 300 disposed below the thermoelectric module 100 is illustrated. The first heat conversion unit 200 and the second heat conversion unit 300 may use a thermoelectric effect implemented by the first substrate 140 and the second substrate 150 of the thermoelectric module 100 to convert air being introduced or discharged into heated air. When the thermoelectric module 100 having the structure illustrated in FIG. 8 is applied to the structure in FIG. 1 or FIG. 2 according to an embodiment of the present invention, the second heat conversion unit 300 may be removed, and the structure of the second heat conversion unit 300 may be changed to be in contact with the light source module 20 of FIGS. 1 and 2 to improve cooling efficiency as described above.

The heat generation unit is implemented at the first heat conversion unit 200 to allow air that has passed through the first air blowing module 42 such as a blower fan to pass through the first heat conversion member (52 in FIG. 2, 220 in FIG. 8) and become warm air in the structure of FIG. 2. The first heat conversion unit 200 allows a first heat conversion member 220 to be disposed on the first substrate 140. Since this structure is the same as the second heat conversion unit 300 allowing a second heat conversion member 320 to be disposed on the second substrate 150, a structure having the first heat conversion member 220 of the first heat conversion unit 200 will be described as an example.

As illustrated in FIG. 8, the first heat conversion unit 200 may be disposed in a structure in contact with the first substrate 140. In this way, air that has passed through the first heat conversion member 220 of the first heat conversion unit 200 may be converted into warm air with an increased temperature by the heat generating action and pass through the airflow channel unit 32 of FIG. 2 to be supplied to the lens unit 10.

As in the structure illustrated in FIG. 8, although the first heat conversion member 220 in the first heat conversion unit 200 that realizes a heat generation function and the second heat conversion member 320 in the second heat conversion unit 300 that realizes a heat absorption function may be implemented in a structure of directly being in contact with the first substrate 140 and the second substrate 150, the first heat conversion member 220 and the second heat conversion member 320 may also be formed in a structure of being disposed in separate accommodation modules 210 and 310.

Figure 9:
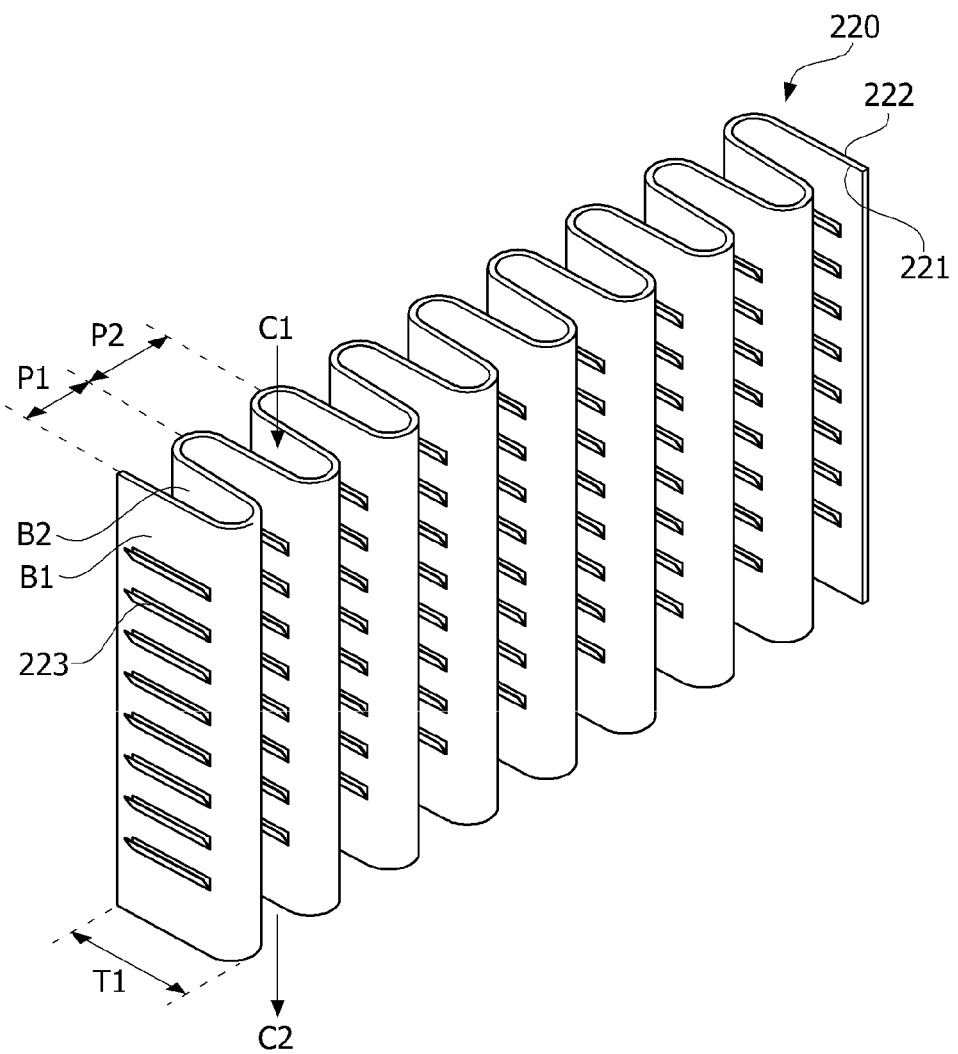
FIG. 9 is a specified view of a structure of a first heat conversion member according to an embodiment of the present invention described with reference to FIG. 8.
Figure 10:
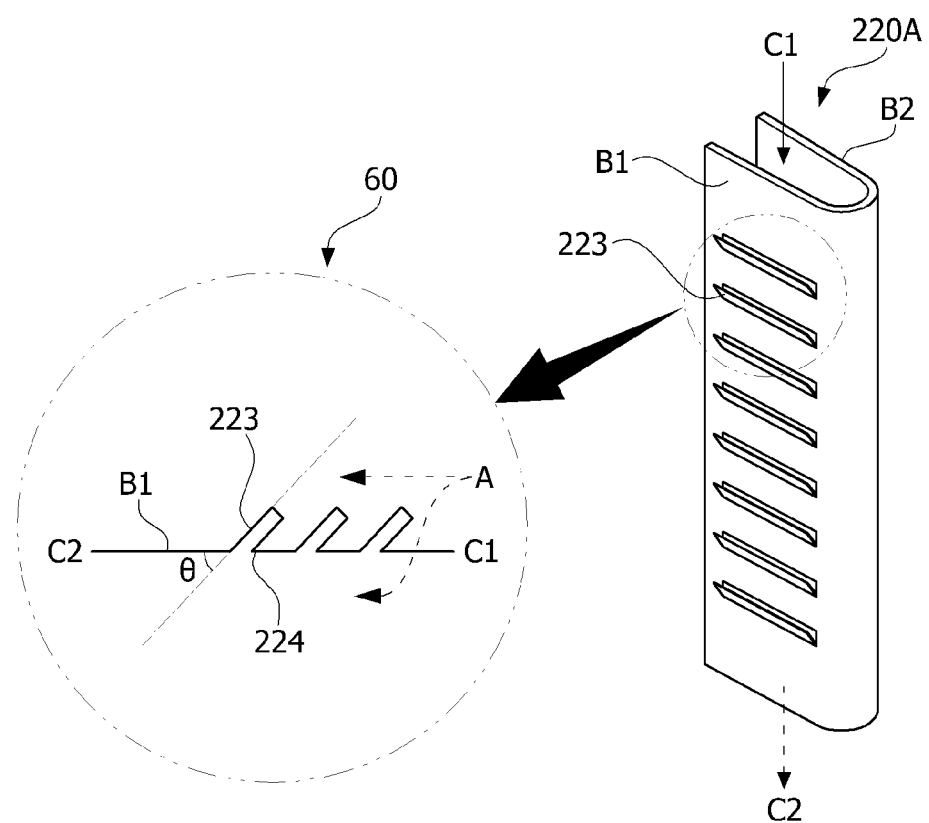
FIG. 10 is an enlarged conceptual view of a structure in which one flow channel pattern is formed at the first heat conversion member.

FIG. 9 is a specified view of a structure of the first heat conversion member 220 according to an embodiment of the present invention described with reference to FIG. 8, and FIG. 10 is an enlarged conceptual view of a structure in which one flow channel pattern 220A is formed at the first heat conversion member 220. Since the same structure may also be applied to the structure of the second heat conversion member 320 on the second substrate 150, hereinafter, the structure of the first heat conversion member 220 will be mainly described.

As illustrated in FIG. 9, the first heat conversion member 220 may be formed with a structure in which one or more flow channel patterns 220A that form an airflow channel C1, which is a predetermined airflow passage, is implemented on a flat plate-shaped base material of a first flat surface 221 and a second flat surface 222, which is the opposite surface of the first flat surface 221, so that the surfaces are in contact with air.

As illustrated in FIG. 9, the flow channel pattern 220A may also be implemented using a structure of folding a base material so that a curvature pattern having predetermined pitches P1 and P2 and a height T1 is formed. According to an embodiment of the present invention, the first and second heat conversion members 220 and 320 may be in a structure having two flat surfaces in contact with air and a flow channel pattern for maximizing a surface area in contact with air.

In the structure illustrated in FIG. 9, when air is introduced in a direction of the flow channel C1 of an air introduction unit, the air may flow toward an end C2 of the flow channel while evenly being in contact with the first flat surface 221 and the second flat surface 222, which is the opposite surface of the first flat surface 221. Thus, a contact with a considerably larger amount of air is induced in the same space compared to a simply flat contact surface such that the heat absorption or heat generation effect is further enhanced.

To further increase the area in contact with air, the first heat conversion member 220 according to an embodiment of the present invention may include a resistive pattern 223 on a surface of the base material as illustrated in FIGS. 9 and 10. In consideration of a unit flow channel pattern, the resistive pattern 223 may be formed at each of a first curved surface B1 and a second curved surface B2. The resistive pattern 223 may include a structure protruding toward any one of the first flat surface and the second flat surface facing the first flat surface. Further, the first heat conversion member 220 may further include a plurality of fluid flow grooves 224 penetrating through a surface of the base material. By the flow grooves 224 being further included, contact with and flow of air between the first flat surface and the second flat surface of the first heat conversion member 220 may become freer.

As in the enlarged partial view of FIG. 10, the resistive pattern 223 may be formed with a protruding structure tilted to have a tilt angle θ in a direction in which air enters to maximize friction with air to further increase an area in contact with air or contact efficiency with air. The tilt angle θ is preferably formed such that a horizontal extension line of a surface of the resistive pattern and an extension line of a surface of the base material form an acute angle. This is because an effect of resistance is decreased when the tilt angle θ is a right angle or an obtuse angle.

The flow grooves 224 described above may be disposed at a connection portion between the resistive pattern and the base material to increase resistance against fluid such as air as well as make flow to the opposite surface efficient. Specifically, the flow grooves 224 may be formed at a surface of the base material at a front portion of the resistive pattern 223 to allow some of the air in contact with the resistive pattern 223 to pass through a front surface and a rear surface of the base material to further increase a frequency or area in contact with air.

A structure in which the flow channel pattern has a predetermined pitch and cycle is illustrated in FIG. 10. However, unlike this, a pitch of a unit flow channel pattern may not be uniform, a cycle of the pattern may also be changed to be irregular, and, further, the height T1 of each unit flow channel pattern may also be changed to be irregular.

Although a structure in which one heat conversion member is included in a heat conversion module in a heat transfer device according to an embodiment of the present invention is described with reference to FIGS. 8 to 10, a plurality of heat conversion members may be stacked in one heat transfer module according to another embodiment. In this way, a surface area in contact with air and the like may be further maximized, and a larger number of heat transfer members may be disposed in the same volume since the heat conversion member of the present invention is formed in the folded structure in which many contact surfaces can be implemented in a small area. Of course, in this case, a support substrate including a second middle member may be further disposed between the stacked heat conversion members. Further, according to yet another embodiment of the present invention, a structure having two or more thermoelectric modules may also be implemented.

In addition, a pitch of the first heat conversion member of the thermoelectric module (the first substrate) that forms the heat generation unit and a pitch of the second heat conversion member of the thermoelectric module (the second substrate) that forms the heat absorption unit may also be different from each other. In this case, the pitch of a flow channel pattern of the heat conversion member in the heat conversion module that forms the heat generation unit may be larger than that of a flow channel pattern of the heat conversion member in the heat conversion module that forms the heat absorption unit. In this case, the ratio of the pitch of the first heat conversion member of the first heat conversion unit to that of the second heat conversion member of the second heat conversion unit may belong within a range of 0.5:1 to 2.0:1.

The structure of the heat conversion member according to an embodiment of the present invention that forms a flow channel pattern is capable of implementing a considerably larger contact area within the same volume compared to the heat conversion member formed in a flat plate shaped structure or a conventional heat dissipation fin structure. Thus, the area in contact with air may be increased by 50% or more compared to the heat conversion member formed in a flat plate shaped structure, and accordingly, the size of a module may also be considerably reduced. Furthermore, the heat conversion member may include synthetic resin and a metal material with high heat transfer efficiency such as aluminum.

Hereinafter, a modified embodiment in which the shape of the thermoelectric semiconductor elements disposed in the thermoelectric module 100 applied to the vehicular lamp structure illustrated in FIGS. 1 and 2 is changed to improve heat generation efficiency will be described.

Figure 11:
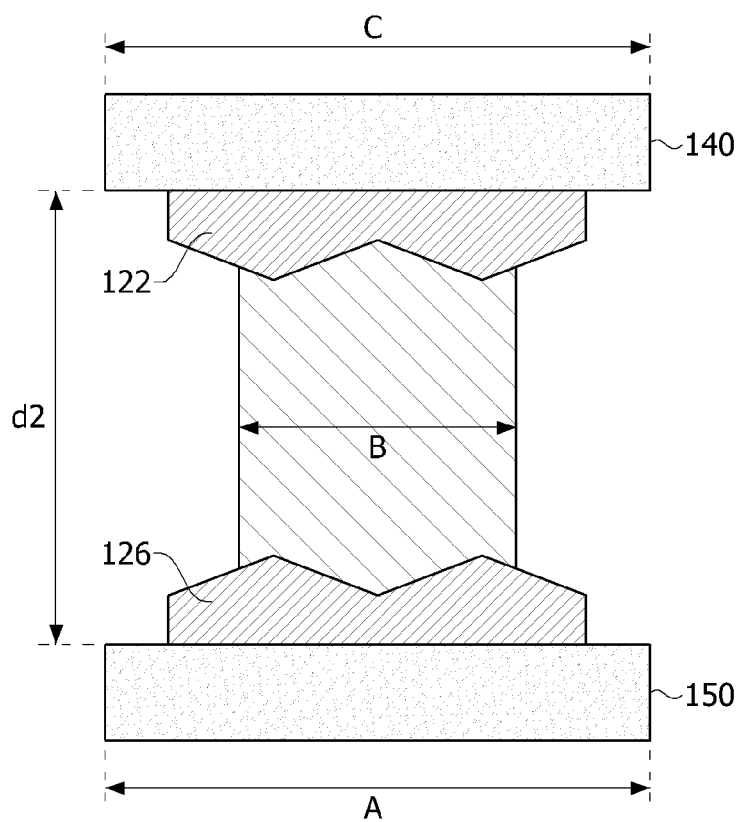
FIG. 11 is a view illustrating a modified shape of a thermoelectric semiconductor element.

A modified shape of the thermoelectric semiconductor elements illustrated in FIG. 11 may be applied to the unit structure of the thermoelectric module illustrated in FIG. 6. Referring to FIGS. 6 and 11, the thermoelectric element 120 according to a modified embodiment of the present invention may be implemented with a structure including a first element unit 122 having a first cross-sectional area, a second element unit 126 having a second cross-sectional area at a position facing the first element unit 122, and a connection unit 124 having a third cross-sectional area that connects the first element unit 122 and the second element unit 126 to each other. In this case, a cross-sectional area in any region in a horizontal direction of the connection unit 124 may be smaller than the first cross-sectional area and the second cross-sectional area.

When the same amount of the same material used for manufacturing a thermoelectric element formed in a structure having a single cross-sectional area such as a cubic structure is applied in manufacturing the thermoelectric element having the structure described above, areas of the first element unit 122 and the second element unit 126 may be increased and the length of the connection unit may be lengthened such that there may be an advantage in that a temperature difference ΔT between the first element unit 122 and the second element unit 126 may be large. When the temperature difference ΔT is increased, an amount of free electrons moving between a hot side and a cold side increases, thus increasing an amount of electricity generated and improving efficiency of heat generation or cooling.

Consequently, the thermoelectric element 120 according to the embodiment implements horizontal cross-sectional areas of the first element unit 122 and the second element unit 126 implemented in a flat plate shaped structure or other three-dimensional structures to be large and extends the length of the connection unit to allow the cross-sectional area of the connection unit to be reduced. In the embodiment of the present invention, a ratio of a width B of a cross-section having the largest width among horizontal cross-sections of the connection unit to a width A or C of a larger cross-section of the horizontal cross-sections of the first element unit 122 and the second element unit 126 may belong within a range of 1:1.5 to 1:4. When the ratio deviates from this range, heat may be conducted from the hot side to the cold side and cause a decrease in electricity generation efficiency or a decrease in efficiency of heat generation or cooling.

According to another aspect of the embodiment of such a structure, in the thermoelectric element 120, longitudinal thicknesses al and a3 of the first element unit 122 and the second element unit 126 may be smaller than a longitudinal thickness s2 of the connection unit 124.

In the embodiment, the first cross-sectional area, which is a horizontal cross-sectional area of the first element unit 122, and the second cross-sectional area, which is a horizontal cross-sectional area of the second element unit 126, may be different from each other. This is to easily control the temperature difference to a desired level by adjusting thermoelectric efficiency. Further, the first element unit 122, the second element unit 126, and the connection unit 124 may be integrally formed with each other. In this case, each of the first element unit 122, the second element unit 126, and the connection unit 124 may be formed with the same material.

Figure 12:
FIG. 12 is a view illustrating an example of implementing the structure of the thermoelectric semiconductor element according to an embodiment of the present invention illustrated in FIGS. 6 and 11 using different construction method and configuration.
Figure 12:
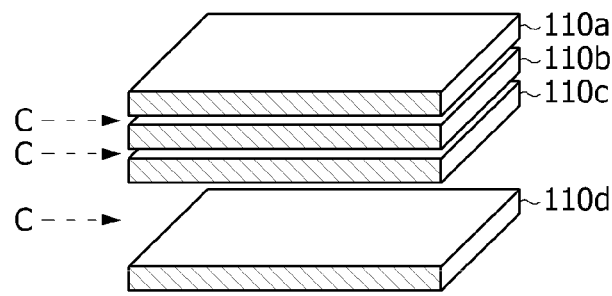
Figure 12:
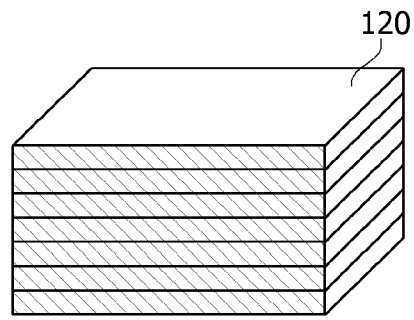
Figure 12:
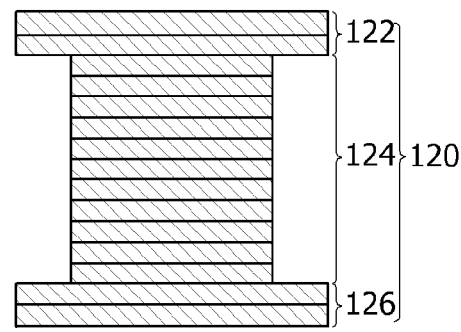

FIG. 12 is a view illustrating an example of implementing the structure of the thermoelectric semiconductor element according to an embodiment of the present invention illustrated in FIGS. 6 and 11 using different construction method and configuration.

Referring to FIG. 12, according to still another embodiment of the present invention, the structure of the semiconductor element described above may be implemented with a stacking type structure instead of a bulk type structure to be thinned and further improve cooling efficiency. Specifically, the structure of the first semiconductor element 120 and the second semiconductor element 130 illustrated in FIG. 6 or 11 may be formed with unit members in which a plurality of structures to which a semiconductor material is applied are stacked on a sheet-shaped base material, and the unit members may be cut to prevent loss of materials and improve the electrical conductivity property.

With respect to the above, referring to FIG. 12, FIG. 12 illustrates a conceptual view of a process of manufacturing the unit members in the stacking structure described above. According to FIG. 12, a material including a semiconductor material is manufactured in a paste form, and the paste is applied onto a base material 111 such as a sheet and a film to form a semiconductor layer 112 to form one unit member 110. As illustrated in FIG. 12, a plurality of unit members 110a, 110b, and 110c are stacked to form a stacking structure, and the stacking structure is cut to form a unit thermoelectric element 120. That is, the unit thermoelectric element 120 according to the present invention may be formed with a structure in which the unit member 110 formed by stacking the semiconductor layer 112 on the base material 111 is stacked in a plurality.

In the process described above, the process of applying a semiconductor paste onto the base material 111 may be performed using various methods. For example, the process may be performed by tape casting, i.e., manufacturing a slurry by mixing very fine semiconductor material powder with an aqueous or a non-aqueous solvent and any one selected from a binder, a plasticizer, a dispersant, a defoamer, and a surfactant, and then forming the slurry in a predetermined thickness according to a purpose with a moving blade or a moving base material being transported. In this case, a material such as a film and a sheet having a thickness in a range of 10 um to 100 um may be used for the lease material, and the p-type semiconductor material and the n-type semiconductor material used for manufacturing the bulk type element described above may be applied without change to the semiconductor material being applied.

In the process of aligning and stacking the unit members 110 in multiple layers, the unit members 110 may be pressed at a temperature of 50° C. to 250° C. and formed into a stacking structure. In an embodiment of the present invention, the number of the unit members 110 being stacked may be in a range of 2 to 50. Then, the process of cutting the stacking structure into a desired form and size may be performed, and a sintering process may be added.

The unit thermoelectric element formed by stacking the plurality of unit members 110 according to the process described above may ensure uniformity in thickness, shape, and size. That is, since the bulk-shaped thermoelectric element is manufactured by performing ingot grinding and refining ball-mill processes and then cutting a sintered bulk structure, there are problems in that a large amount of material is lost in the cutting process, it is difficult to cut in uniform sizes, and it is difficult to thin the thermoelectric element due to a large thickness of about 3 mm to 5 mm. Since the unit thermoelectric element formed in the stacking structure according to an embodiment of the present invention is manufactured by stacking sheet-form unit members in multiple layers and cutting the sheet stacking structure, there is almost no loss of material, uniformity of the material can be ensured since the material has a uniform thickness, the unit thermoelectric element may be thinned to a thickness of 1.5 mm or less, and the thermoelectric element may have various shapes.

The final structure may be implemented by being cut into a shape shown in (d) of FIG. 12, which is similar to the shape of the structure of the thermoelectric element according to an embodiment of the present invention described above with reference to FIG. 6 or 11.

In the process of manufacturing the unit thermoelectric element according to an embodiment of the present invention, the process of forming the stacking structure of the unit member 110 may further include forming a conductive layer on a surface of each unit member 110.

Figure 13:
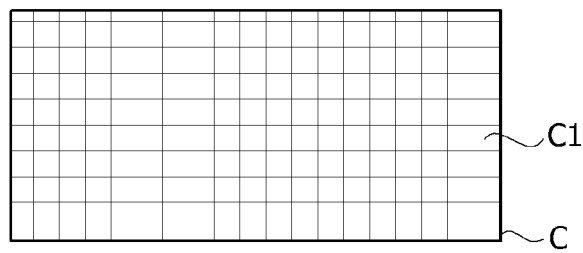
FIG. 13 is a view illustrating a modified example of a conductive layer according to an embodiment of the present invention.
Figure 13:
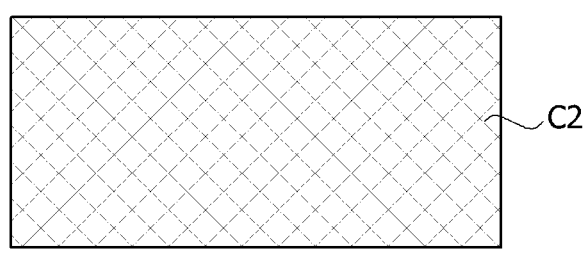
Figure 13:
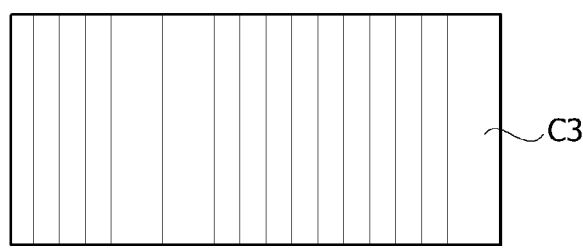
Figure 13:
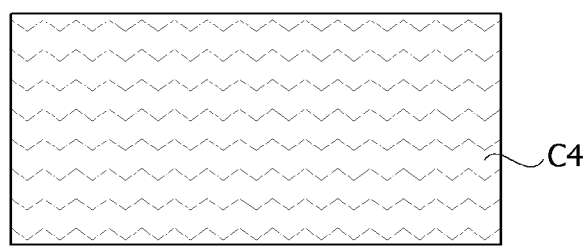

A conductive layer having a structure illustrated in FIG. 13 may be formed between unit members of the stacking structure illustrated in (c) of FIG. 12. The conductive layer may be formed at the opposite surface from a base material surface on which a semiconductor layer is formed. In this case, the conductive layer may be formed as a patterned layer to allow a region through which a surface of a unit member is exposed to be formed. In this way, there may be advantages in that electrical conductivity may be improved compared to when the conductive layer is applied to an entire surface, a bonding force between the unit members may be improved, and thermal conductivity may be lowered.

Various modified examples of a conductive layer C according to an embodiment of the present invention are illustrated in FIG. 13. A pattern in which a surface of a unit member is exposed may include a mesh type structure including closed type opening patterns c1 and c2 as illustrated in (a) and (b) of FIG. 13 and a linear structure including opened type opening structures c3 and c4 as illustrated in (c) and (d) of FIG. 13. The conductive layer has advantages in that a bonding force between unit members inside a unit thermoelectric element formed by a stacking structure of the unit members is improved, and thermal conductivity between the unit members is lowered, and electrical conductivity is improved. Cooling capacity Qc and ΔT (° C.) are improved compared to a conventional bulk type thermoelectric element, and a power factor increases by 1.5, i.e., the electrical conductivity increases by 1.5. Since an increase in electrical conductivity is directly related to an improvement in thermoelectric efficiency, cooling efficiency is improved. The conductive layer may be formed with a metal material, and the metal material may include a metal-based electrode material including Cu, Ag, and Ni.

When the unit thermoelectric element having the stacking structure described with reference to FIG. 12 is applied to the thermoelectric module illustrated in FIGS. 6 and 7, i.e., when the thermoelectric element according to an embodiment of the present invention is disposed between the first substrate 140 and the second substrate 150, and the thermoelectric module is implemented with a unit cell formed with a structure including an electrode layer and a dielectric layer, the overall thickness Th may be formed in the range of 1.0 mm to 1.5 mm. Thus, the thermoelectric module may be considerably thinned compared to using a conventional bulk-shaped element. In this case, when a device for removing dew of the vehicular lamp according to an embodiment of the present invention described with reference to FIG. 2 is implemented, a limited space may be efficiently utilized.

Figure 14:
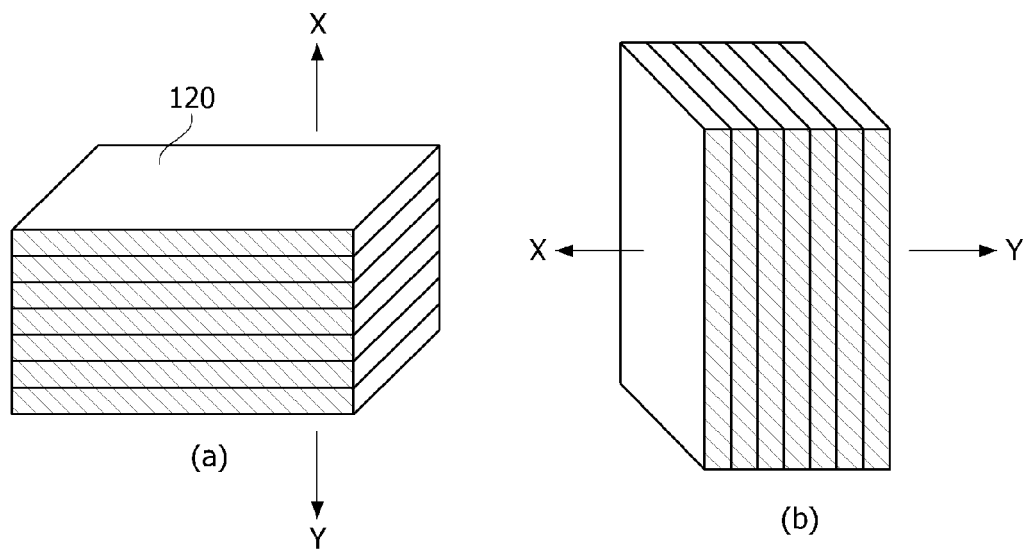
FIG. 14 is a view illustrating an arrangement of a thermoelectric element according to an embodiment of the present invention.
Figure 14:
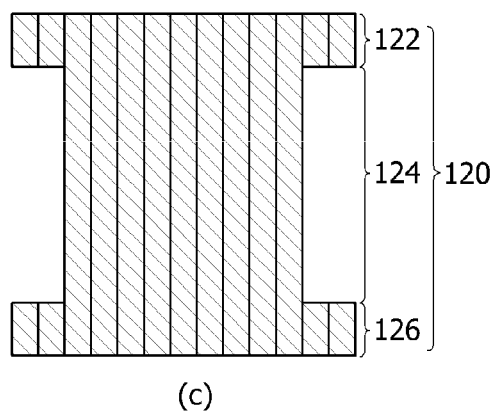

As illustrated in FIG. 14, the thermoelectric elements 120 and 130 described with reference to FIG. 9 may be formed by being horizontally aligned in an upper direction X and a lower direction Y as in (a) of FIG. 14 and being cut as shown in (c) of FIG. 14.

That is, although a thermoelectric module may be formed with a structure in which the first substrate, the second substrate, the semiconductor layer, and the surface of the base material are disposed to be adjacent to each other, the thermoelectric element itself may also vertically stand as illustrated in (b) of FIG. 14 so that a side surface portion of the unit thermoelectric element is disposed to be adjacent to the first and second substrates. In such a structure, an end portion of the conductive layer is exposed from a more sideward portion compared to the horizontally disposed structure, and thermal conduction efficiency in the vertical direction is lowered while the electrical conductivity property is improved such that cooling efficiency may be further improved. Furthermore, the shape illustrated in FIG. 11 may be formed by being cut as in (c) of FIG. 14.

As described above, in the thermoelectric element applied to the thermoelectric module of the present invention capable of being implemented in various embodiments, the shapes and sizes of the first semiconductor element and the second semiconductor element facing each other may be the same. However, considering that a difference between electrical conductivities of the p-type semiconductor element and the n-type semiconductor element acts as a factor that lowers cooling efficiency, volumes of the semiconductor elements facing each other may also be differently formed to improve cooling performance.

That is, the volumes of the semiconductor elements facing each other may be differently formed by differently forming overall shapes of the semiconductor elements, forming a diameter of a cross-section of any one of the semiconductor elements having the same height to be wider, or differently forming heights or diameters of cross-sections of the semiconductor elements of the same shape. The diameter of the n-type semiconductor element may be formed to be larger than that of the p-type semiconductor element to increase the volume of the n-type semiconductor element to improve thermoelectric efficiency.

The thermoelectric element in various structures according to an embodiment of the present invention described above and the thermoelectric module including the same may be applied to a structure that implements warm air with an airflow channel unit in the vehicular lamp illustrated in FIGS. 1 and 2.

According to an embodiment of the present invention, a thermoelectric circulation unit is implemented using a structure in which a heat absorption unit of a thermoelectric module is in contact with a heat generation source of a light source of a vehicular lamp to simultaneously promote heat dissipation from the light source of the vehicular lamp, raise the temperature of the heat absorption unit of the thermoelectric module, and raise the temperature of a heat generation unit, thereby efficiently raising the temperature of hot air for dehumidification.

In this way, the heat absorption unit of the thermoelectric module demonstrates a function of dissipating heat from the vehicular lamp and a function of controlling implementation of high-temperature hot air by raising the temperature of the heat generation unit at the opposite side, thereby maximizing a dehumidification effect.

Further, by a function of the thermoelectric circulation unit, dehumidification of a lens of the vehicular lamp can be efficiently implemented.

Further, according to another aspect of an embodiment of the present invention, an airflow channel unit can be provided at a bezel unit essentially provided near a light source of a vehicular lamp to simplify an air blowing structure, and air can not only be provided to an entire surface of a lens but also be selectively provided to a partial region of a lens surface, thereby considerably reducing capacities of a thermoelectric module and an air blowing module.

That is, in a thermoelectric circulation unit according to an embodiment of the present invention, air heated by the thermoelectric module can fundamentally prevent dew formation by raising the temperature of a lens surface of a head lamp. In this case, warm air or hot air can be selectively provided to a partial region where dew is formed.

Particular embodiments of the present invention have been described in the detailed description above. However, the present invention may be modified in various ways within the scope not departing from the scope of the present invention. The technical spirit of the present invention should not be defined in a limiting sense by the embodiments described above but should be defined by the claims as well as their equivalents.

<Description of symbol>

| | |
|---|---|
| 10: LENS UNIT | 20: LIGHT SOURCE MODULE |
| 30: BEZEL UNIT | 32: AIRFLOW CHANNEL UNIT |
| 40: THERMOELECTRIC CIRCULATION UNIT | |
| 52: FIRST HEAT CONVERSION MEMBER | |
| 100: THERMOELECTRIC MODULE | 110: UNIT MEMBER |
| 111: BASE MATERIAL | 112: SEMICONDUCTOR LAYER |
| 120: THERMOELECTRIC ELEMENT | 122: FIRST ELEMENT UNIT |
| 124: CONNECTION UNIT | 126: SECOND ELEMENT UNIT |
| 130: THERMOELECTRIC ELEMENT | 132: FIRST ELEMENT UNIT |
| 134: CONNECTION UNIT | 136: SECOND ELEMENT UNIT |
| 140: FIRST SUBSTRATE | 150: SECODN SUBSTRATE |
| 160A, 160B: ELECTRODE LAYER | |
| 170A, 170B: DIELECTRIC LAYER | |
| 181, 182: CIRCUIT WIRE | |

<Description of symbol>

200, 300: HEAT CONVERSION UNIT
210, 310: HEAT CONVERSION UNIT HOUSING
220, 320: HEAT CONVERSION MEMBER

What is claimed is:

1. A vehicular lamp comprising:
a lens unit;
a light source module including a reflection unit disposed to have a gap from the lens unit and configured to accommodate a light emitting element;
a bezel unit configured to abut the light source module and provide the gap between the lens unit and the light source module; and
a thermoelectric circulation unit configured to provide air that has passed through a thermoelectric module to the inside of the gap,
wherein the thermoelectric module includes:
a first substrate and a second substrate facing each other; and
a plurality of thermoelectric semiconductor elements disposed between the first substrate and the second substrate,
wherein the second substrate includes a heat absorption unit, and
wherein one end of the second substrate extends to be in contact with a reflection unit of the light source module.

2. The vehicular lamp of claim 1 further comprising:
a first heat conversion member disposed on the first substrate; and
a second heat conversion member disposed on the second substrate.

3. The vehicular lamp of claim 2, wherein the thermoelectric circulation unit includes a first air blowing module configured to provide air to the first heat conversion member.

4. The vehicular lamp of claim 3, further comprising an air blowing guide unit having one end connected to the first heat conversion member and the other end communicating with the gap.

5. The vehicular lamp of claim 1, further comprising an airflow channel unit provided inside or at a surface of the bezel unit, wherein:
one end of the airflow channel unit communicates with the thermoelectric circulation unit; and
the other end of the airflow channel unit communicates with the gap.

6. The vehicular lamp of claim 5, wherein at least one thermoelectric circulation unit connected to the airflow channel unit is included.

7. The vehicular lamp of claim 5, further comprising a second air blowing module disposed in the airflow channel unit.

8. The vehicle lamp of claim 5, wherein the other end of the air flow channel unit is connected to air discharge units exposed to surface areas of the bezel unit.

9. The vehicle lamp of claim 8, wherein the air discharge units are provided in at least two areas of the surface areas of the bezel unit.

10. The vehicle lamp of claim 9, wherein the air discharge units are provided to discharge air in a downward direction of the lens unit.

11. The vehicle lamp of claim 9, wherein the air discharge units are provided to discharge air in an edge direction of the lens unit.

12. The vehicle lamp of claim 9, wherein the air discharge units are provided in at least one structure of a wedge-shaped hole structure and a slit structure.

13. A vehicular lamp comprising:
a lens unit;
a light source module including a reflection unit disposed to have a gap from the lens unit and configured to accommodate a light emitting element;
a bezel unit configured to abut the light source module and provide the gap between the lens unit and the light source module; and
a thermoelectric circulation unit configured to provide air that has passed through a thermoelectric module to the inside of the gap,
wherein the thermoelectric module includes:
a first substrate and a second substrate facing each other;
a plurality of thermoelectric semiconductor elements disposed between the first substrate and the second substrate,
a first heat conversion member disposed on the first substrate; and
a second heat conversion member disposed on the second substrate,
wherein the second substrate includes a heat absorption unit, and
wherein one end of the second heat conversion member is in contact with the light source module.

14. The vehicular lamp of claim 13, wherein the thermoelectric circulation unit includes a first air blowing module configured to provide air to the first heat conversion member.

15. The vehicular lamp of claim 14, further comprising an air blowing guide unit having one end connected to the first heat conversion member and the other end communicating with the gap.

16. The vehicular lamp of claim 13, further comprising an airflow channel unit provided inside or at a surface of the bezel unit, wherein:
one end of the airflow channel unit communicates with the thermoelectric circulation unit; and
the other end of the airflow channel unit communicates with the gap.

17. The vehicular lamp of claim 16, wherein at least one thermoelectric circulation unit connected to the airflow channel unit is included.

18. The vehicular lamp of claim 16, further comprising a second air blowing module disposed in the airflow channel unit.

19. The vehicle lamp of claim 16, wherein the other end of the air flow channel unit is connected to air discharge units exposed to surface areas of the bezel unit.

20. The vehicle lamp of claim 19, wherein the air discharge units are provided in at least two areas of the surface areas of the bezel unit.

* * * * *